Dec. 4, 1962 C. J. BOWMAN 3,067,337

SERVO AMPLIFIER USING PUSH-PULL, COMPLEMENTARY, CASCADED, TRANSISTORS WITH MEANS TO SUPERIMPOSE A HIGHER A.C. FREQUENCY ON INFORMATION SIGNAL

Filed June 3, 1957

INVENTOR.
CHARLES J. BOWMAN
BY
L. W. Wright & H. T. Kaiser
ATTORNEYS.

United States Patent Office 3,067,337

Patented Dec. 4, 1962

3,067,337

SERVO AMPLIFIER USING PUSH-PULL, COMPLEMENTARY, CASCADED, TRANSISTORS WITH MEANS TO SUPERIMPOSE A HIGHER A.C. FREQUENCY ON INFORMATION SIGNAL

Charles J. Bowman, Cincinnati, Ohio, assignor to The Cincinnati Milling Machine Co., Cincinnati, Ohio, a corporation of Ohio Filed June 3, 1957, Ser. No. 663,061

2 Claims. (Cl. 307—88.5)

This invention relates to a transistor servo aplifier, and more particularly, to an amplifier employing a pair of transistors of opposite conductivity types arranged in push-pull relationship. This amplifier is adapted to provide power amplification of a D.C. signal such as may be obtained from the phase sensitive detector of a servomechanism system.

Although it has heretofore been known that transistors of opposite conductivity types could be arranged in a push-pull circuit by use of the so-called "complementary symmetry" configuration, amplifiers embodying this design have not proved suitable for use in servomechanisms requiring a D.C. amplifier. For example, in servo systems of the type in which an A.C. error signal is converted into a D.C. signal by a phase sensitive detector, which signal must then be amplified to provide the power required to drive a transducer, it has been found that a transistor amplifier of the complementary symmetry type operating in Class B is insensitive to small D.C. signals so that a "dead spot" is found to occur in the vicinity of the null voltage point. This is objectionable since it prevents the servomechanism from following small actuating signals and introduces an error into the system when it is operating under essentially static conditions. I have found, however, that this difficulty may be overcome by introducing into the input of the amplifier a small A.C. signal of higher frequency than the A.C. error signal so that sufficient input to the amplifier is always present in order to overcome the "dead spot." The servomechanism will therefore respond to all actuating signals, no matter how small their magnitude. The A.C. input signal to the amplifier is, of course, amplified along with the D.C. error signal by the transistor amplifier. This, however, is not objectionable in the case of an electrohydraulic servo system, since the A.C. component is useful in providing "dither" to the electro-hydraulic valve. This "dither," or high frequency vibration of the valve, is effective in overcoming the static friction which resists movement of the valve away from a position of rest and prevents the servomechanism from accurately following small command signals. In case the A.C. component in the output of the servo amplifier is undesirable, the output signal from the servo amplifier can be filtered to obtain the amplified D.C. component only.

Accordingly, it is an object of the present invention to provide a push-pull transistor servo amplifier operating in Class B which is characterized by its sensitivity to small signals in the vicinity of the null.

Another object of the invention is to provide a D.C. servo amplifier employing transistors arranged in complementary symmetry in which an A.C. signal is applied to the input of the amplifier in conjunction with the D.C. input signal to render the amplifier sensitive to small error signals in the vicinity of the null.

With these and other objects in view, which will become apparent from the following description, the invention includes certain novel features of construction and combinations of parts, the essential elements of which are set forth in the appended claims, and a preferred form or embodiment of which will hereinafter be described with reference to the drawings which accompany and form a part of this specification.

Figure 1:
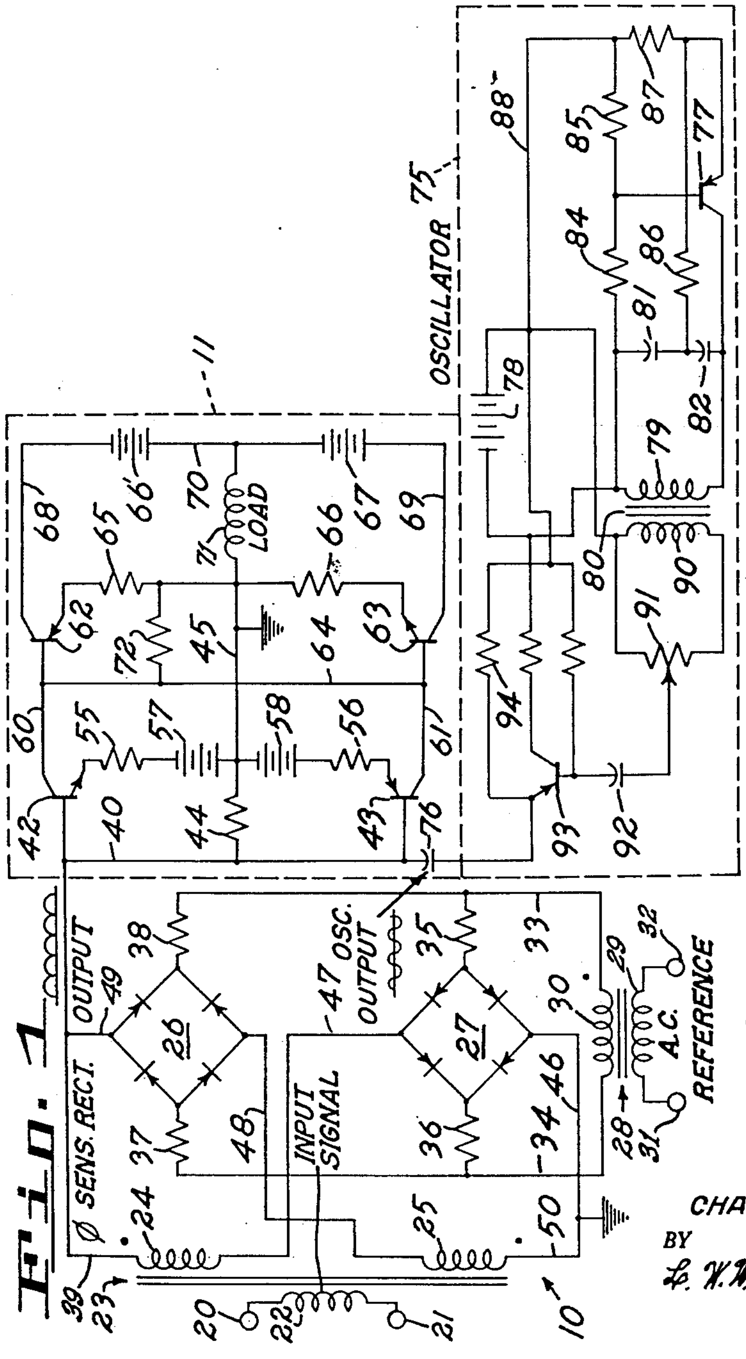
FIG. 1 is a wiring diagram of the transistor servo amplifier.

The servo amplifier, which forms the subject of the present patent application, may be used in a servomechanism of the type shown in U.S. Patent No. 2,768,-478, patented October 30, 1956, on an application filed by C. E. Waller. As shown in this patent, the opposed secondary windings 59 and 60 (FIG. 11 of the patent) of a differential transformer are inductively coupled with a primary winding 8 by an armature 63 connected to a tracing finger 105 bearing against the tooth of a pattern 42 (FIG. 1 of the patent). The resultant output signal from the secondaries 59 and 60 appearing across terminals 180 and 181 is converted by a phase sensitive detector (FIG. 8 of the patent) into a D.C. output at terminals 193 and 194 which is thereafter amplified by a power bridge amplifier (FIG. 9 of the patent). The output from the bridge amplifier is applied to the coil 199 of a servo valve 209 (FIG. 7 of the patent) which controls the hydraulic servo motor 45. This motor drives the pattern 42 (FIG. 1 of the patent) in the proper direction to restore the finger 105 to its normal position. There is thereby provided a "null seeking" servo-loop which causes the tracing finger to follow the contour of the tooth on the pattern as it is traversed therealong.

Figure 2:
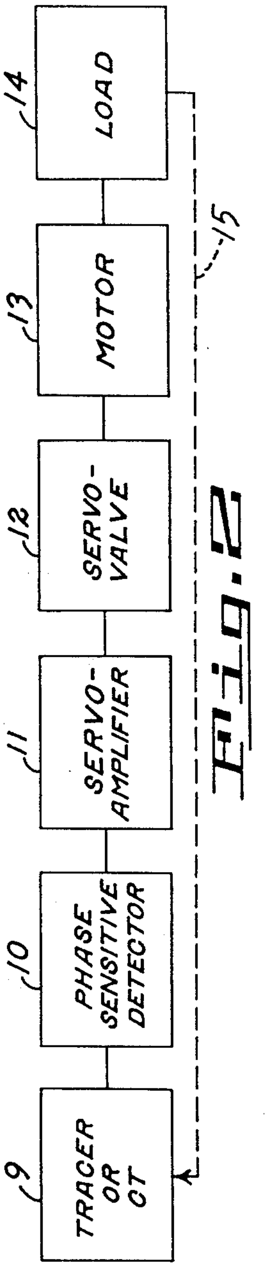
FIG. 2 is a block diagram illustrating a typical application of the servo amplifier shown in FIG. 1.

In FIG. 2 of the present application is shown a block diagram of a similar servomechanism in which the A.C. signal from a tracer or synchro control transformer 9 is converted into a D.C. signal by a phase sensitive detector 10. This signal is amplified by the servo amplifier 11 and utilized to energize the operating coil of a servo valve 12 which controls the hydraulic motor 13. This motor drives a load 14 and is provided with a suitable feedback connection 15 to the tracer, or control transformer, to thereby provide a closed servo-loop.

For satisfactory service in this type of application, the amplifier 11 must be capable of producing an output signal of considerable power in order to provide the necessary driving force for operating the servo valve 12. The output impedance of the amplifier should be low in order to match the low impedance of the coil which drives the valve. Although linearity is not important in amplifiers used in null seeking servomechanisms, it is important that the amplifier be such as to provide high sensitivity in the vicinity of the null in order to insure accurate positioning of the load in response to small command signals. At the same time, of course, the amplifier must be stable at the null in order to prevent oscillation of the system.

The transistor amplifier, hereinafter to be described, meets all of these requirements and provides, in addition, a highly efficient amplifier of small size which is particularly suitable for use with servomechanisms. In this amplifier, the transistors are operated in Class B in a push-pull circuit employing complementary symmetry, thereby obtaining the advantages of high efficiency with extreme simplicity of design. To eliminate crossover distortion at the null, which is characteristic of this type of arrangement even with a large amount of negative feedback, I have discovered that by applying an A.C. signal to the input of the amplifier along with the D.C. error signal from the phase sensitive detector, the amplifier may be driven back and forth across this region of low sensitivity so as to provide satisfactory response to small error signals in the null region. This A.C. signal has the additional advantage of providing dither to the servo valve to maintain it "alive" and ready for instant response to small changes in the error signal.

In FIG. 1 there is shown a phase sensitive detector employing crystal diodes connected in a ring demodulator arrangement. In this circuit the A.C. error voltage to be rectified is applied to terminals 20 and 21 of primary winding 22 of a transformer 23. This transformer has two oppositely wound secondaries 24 and 25 which are connected to the diode rings 26 and 27 as shown. A source of reference voltage is provided by a second transformer 28 having a primary winding 29 and a secondary winding 30. The primary winding has terminals 31 and 32 which may be suitably connected to the voltage supply source (not shown) for the tracer or synchro while the secondary winding is connected to the diode rings by conductors 33 and 34 and resistors 35, 36, 37, and 38. The resistors 35–38 are of equal value and provide sufficient resistance to the current supplied by secondary winding 30 to limit the current flow through the diodes to a safe value. The transformers are poled as indicated by the dots at the ends of the secondary windings. Assuming, for the purposes of illustration, that the connections are such that the dot ends of the secondaries are positive, then current from the secondary winding 30 will flow through conductor 33, resistor 35, diode ring 27, resistor 36, and conductor 34. The diode ring 26 will be nonconducting during this half cycle. Since the upper end of secondary winding 24 is positive, current will flow through a conductor 39 to a conductor 40 which is connected to the base electrodes of a pair of driver transistors 42 and 43. The main current flow will be through transistor 42 although a small amount of current will also flow through a resistor 44, one end of which is connected to the conductor 40 and the other end of which is connected to a grounded conductor 45. The current will then return through ground to conductor 46 of the phase sensitivity detector and thence through the diodes of ring 27 to a conductor 47 which is connected to the lower end of the secondary winding 24. On the next half cycle, the opposite ends of the secondary windings will be positive and the diode ring 26 will conduct while the ring 27 will be non-conducting. Since the upper end of the secondary winding 25 will now be positive, current will flow through a conductor 48, the diode of ring 26, and a conductor 49 to the conductors 39 and 40. It will then flow through transistor 42 and in shunt through resistor 44 to the grounded conductor 45. It will then return through ground to the conductor 50 of the phase sensitive detector and then to the lower end of the secondary winding 25. It will thus be seen that a full-wave pulsating D.C. current will be delivered to the base electrodes of the driver transistors and to the resistor 44. The polarity of this current will be such as to render the conductor 40 positive with respect to ground when the polarities of the dot ends of the secondary windings are positive at the same instant.

Assume now that the phase of the error voltage is reversed in phase, i.e., shifted by 180 degrees, so as to reverse the polarity of the voltage appearing across the secondary windings 24 and 25. The upper end of winding 24 will now be negative when diode ring 27 is conducting, and the conductor 40 will therefore be rendered negative with respect to ground. Current will then flow from the lower (positive) end of winding 24 through conductor 47 and diode ring 27 to ground. From ground, current will flow through transistor 43, and in shunt through resistor 44, to conductors 40 and 39 to the upper end of winding 24. On the next half cycle, when diode ring 26 conducts, the lower end of winding 25 will be at positive potential so that current will flow through conductor 50 to ground and thence through transistor 43, and in parallel through resistor 44, to conductor 40. It will then flow through conductor 49, diode ring 26 and conductor 48 to the upper (negative) end of secondary winding 25. Hence, it will be seen that a full-wave pulsating D.C. current will flow in the detector circuit and the polarity of this current will be such as to render conductor 40 negative with respect to ground.

As shown in FIG. 1, the transistors 42 and 43 are of opposite conductivity types, the transistor 42 being an N-P-N junction transistor, and the transistor 43 being a P-N-P junction transistor. The transistors are connected in a Class B push-pull circuit using a common emitter configuration. The base electrodes are connected to conductor 40 while the emitter electrodes are connected through resistors 55 and 56, and batteries 57 and 58 to the grounded conductor 45. The batteries may, if desired, be replaced by conventional power supplies having suitable voltage and current ratings and are preferably identical as are also the resistors 55 and 56. The resistors 55 and 56 provide degeneration in the emitters and thereby afford additional stability and uniformity of gain. The collector electrodes are connected by conductors 60 and 61 to the base electrodes of a pair of P-N-P and N-P-N power transistors 62 and 63, respectively which are arranged in a Class B push-pull circuit utilizing a common emitter configuration. The conductors 60 and 61 are also joined to one another by a conductor 64 which provides a direct connection between the collector electrodes of the transistors 42 and 43. The emitters of the power transistors are connected to ground through stabilizing resistors 65 and 66 which serve the same function in the power stage as the resistors 55 and 56 in the driver stage. The power source for the power transistors may comprise batteries 66' and 67, as shown, or may consist of suitable power supplies connected in the circuit in the same manner. As shown, the negative terminal of battery 66' is connected by a conductor 68 to the collector electrode of transistor 62 while the positive terminal of battery 67 is connected by a conductor 69 with the collector electrode of transistor 63. The remaining terminals of the batteries are connected together by a conductor 70 and to one of the load, which in this case is comprised of the operating coil 71 for the servo valve. The other end of the load element 71 is connected to the grounded conductor 45 so as to place the load in the common collector circuit for the two power transistors. A resistor 72 of high ohmic value is connected from the conductor 64 to ground to serve as a load in the circuit and prevent the occurrence of high current peaks. In this respect, it functions in the same manner as the resistor 44 which, although of considerably lower ohmic value, acts as a load in the driver stage. The two-stage amplifier operates in a conventional manner to amplify the pulsating D.C. input signal from the phase sensitive detector, the transistors 42 and 62 serving to amplify the signal when positive, and the transistors 43 and 63 serving to amplify the signal when negative.

As earlier mentioned, push-pull transistor amplifiers operating in Class B are subject to crossover distortion on small signals due to the drop in power gain at low emitter currents. This causes a definite "deadspot" to occur in the region of the null which prevents the servomechanism from following small command signals. I have found that this "deadspot" may be completely eliminated by introducing a small A.C. signal to the input of the amplifier along with the D.C. error signal, the A.C. signal being of sufficient magnitude to drive the amplifier back and forth across the "deadspot." For this purpose, I have provided a transistor oscillator 75 which generates an A.C. signal of suitable amplitude and delivers it through a coupling capacitor 76 to the input conductor 40. The oscillator 75 includes a single-frequency, sinewave oscillator circuit of conventional design, together with a transistor amplifier for increasing the amplitude and power of the signal produced thereby. The oscillator includes a transistor 77 which is provided with operating current by a battery 78 or other suitable power source, and a tank circuit comprised of the primary winding 79 of a transformer 80 and capacitors 81 and 82. Suitable operating bias is provided by a voltage divider comprised of resistors 84 and 85, while positive feedback is furnished by a resistor 86 connected between the junction of capacitors 81 and 82 and the emitter electrode of transistor 77. A current limiting resistor 87 is connected at one end to the emiter electrode of the transistor 77 and at the other end to the positive terminal of battery 78 by a conductor 88. The capacitance values of components 81 and 82 may be chosen to give the desired frequency of operation of the oscillator. The value of resistor 86 is chosen so as to provide the best sine-wave output.

The transformer 80 has a secondary winding 90 across which is connected a potentiometer 91. The slider of this potentiometer is coupled by a capacitor 92 to the base electrode of a transistor 93 which serves to amplify that portion of the sine-wave voltage derived from the potentiometer 91. Supply current for the transistor 93 is obtained from the same battery 78 which provides operating current for the oscillator transistor 77. The amplifier is connected in a common collector configuration with RC coupling to the input conductor 40, this coupling including a load resistor 94 and the coupling capacitor 76. Hence, by adjusting the slider of potentiometer 91, a desired amount of A.C. voltage at the frequency provided by the oscillator 75 may be fed into the input of the amplifier 11 along with the D.C. signal from the phase sensitive detector 10.

In one particular servo organization with which I am familiar, it has been found that approximately 0.7 volt output from the oscillator is sufficient to eliminate the "deadspot" due to crossover distortion and also to provide the desired amount of dither to the servo valve 12. It is understood, of course, that this value is given merely by way of illustration and may need to be increased or decreased in order to fulfill the requirements imposed by a particular servo amplifier circuit or servo system. It has also been found that with a 60 cycle error signal fed into the phase sensitive detector from the tracer or synchro, an oscillator frequency of approximately 540 cycles per second, i.e., the ninth harmonic of the reference voltage frequency provides very desirable results in carrying the amplifier through the "deadspot" and in providing effective dither to the valve.

Having thus described my invention with reference to one possible form or embodiment thereof, it is to be understood that the present disclosure is illustrative rather than restrictive and that changes and modifications may be resorted to without departing from the spirit of the invention or the scope of the claims which follow.

I claim:

1. A direct-current, push-pull servo amplifier circuit operating in Class B comprising a first pair of transistors of opposite conductivity types arranged in complementary symmetry, each of said transistors having input, output and common electrodes, a first pair of direct-current supply sources connected between the common electrodes and ground, an input conductor connected to the input electrodes to apply a pulsating direct-current signal of predetermined frequency between said input electrodes and their associated common electrodes, a source of alternating current voltage having a frequency higher than said predetermined frequency and an amplitude which is sufficient to eliminate the dead-spot in the vicinity of the null voltage point, means to connect said voltage source to said input conductor to superimpose the alternating-current voltage on the direct-current signal, a second pair of transistors of opposite conductivity types arranged in complementary symmetry, each of said latter transistors having input, output and common electrodes, means to connect the last-recited common electrodes to ground, a load element having one end thereof connected to ground, a second pair of direct-current supply sources connected between the output electrodes of said second pair of transistors and the other end of said load element, and a direct-current connection between the output electrode of each of said first pair of transistors and an input electrode of said second pair of transistors, said direct current connections being between transistors of opposite conductivity types.

2. A signal translating circuit comprising a full-wave, phase-sensitive detector for producing a pulsating direct-current signal from an alternating-current error signal of variable phase and amplitude, a direct-current, push-pull servo amplifier circuit operating in Class B comprising a first pair of transistors of opposite conductivity types arranged in complementary symmetry, each of said transistors having input, output and common electrodes, a first pair of direct-current supply sources connected between the common electrodes and ground, an input conductor connected to the input electrodes to apply the pulsating direct-current signal between said input electrodes and their associated common electrodes, a source of alternating current voltage having a frequency which is an odd harmonic of the alternating current error signal and an amplitude which is sufficient to eliminate the dead-spot in the vicinity of the null voltage point, means to connect said voltage source to said input conductor to superimpose the alternating-current voltage on the direct-current signal, a second pair of transistors of opposite conductivity types arranged in complementary symmetry, each of said latter transistors having input, output and common electrodes, means to connect the last-recited common electrodes to ground, a load element having one end thereof connected to ground, a second pair of direct-current supply sources connected between the output electrodes of said second pair of transistors and the other end of said load element, and a direct-current connection between the output electrode of each of said first pair of transistors and an input electrode of said second pair of transistors, said direct-current connections being between transistors of opposite conductivity types.

References Cited in the file of this patent

UNITED STATES PATENTS

| | | |
|---|---|---|
| 995,126 | De Forest | June 13, 1911 |
| 1,959,805 | Wittkuhns | May 22, 1934 |
| 1,968,528 | Lampkin | July 31, 1934 |
| 2,297,543 | Eberhardt | Sept. 29, 1942 |
| 2,524,165 | Freedman | Oct. 3, 1950 |
| 2,539,243 | Franklin | Jan. 23, 1951 |
| 2,545,223 | Briggs | Mar. 13, 1951 |
| 2,620,441 | McCoy et al. | Dec. 2, 1952 |
| 2,688,112 | Wimberly | Aug. 31, 1954 |
| 2,768,478 | Waller | Oct. 30, 1956 |
| 2,788,493 | Zawels | Apr. 9, 1957 |
| 2,820,199 | Greefkes | Jan. 14, 1958 |
| 2,822,430 | Lin | Feb. 4, 1958 |
| 2,856,523 | Larew | Oct. 14, 1958 |
| 2,890,418 | Zawels | June 9, 1959 |
| 2,939,080 | Hurwitz | May 31, 1960 |

FOREIGN PATENTS

| | | |
|---|---|---|
| 736,760 | Great Britain | Sept. 14, 1955 |